(12) United States Patent
Paoli et al.

(10) Patent No.: US 7,592,932 B2
(45) Date of Patent: Sep. 22, 2009

(54) METHOD AND DEVICE FOR INTERPOLATING OR DECIMATING A SIGNAL

(75) Inventors: Gerhard Paoli, Villach (AT); Dietmar Sträussnigg, Villach (AT); Gerhard Nössing, Villach (AT); Johannes Hohl, Villach (AT)

(73) Assignee: Infineon Technologies AG, Munich (DE)

( * ) Notice: Subject to any disclaimer, the term of this patent is extended or adjusted under 35 U.S.C. 154(b) by 906 days.

(21) Appl. No.: 10/971,526

(22) Filed: Oct. 22, 2004

(65) Prior Publication Data

US 2005/0147179 A1    Jul. 7, 2005

(30) Foreign Application Priority Data

Oct. 23, 2003   (DE) ................. 103 49 739

(51) Int. Cl.
*H03M 7/00*   (2006.01)
(52) U.S. Cl. ................. 341/61; 341/155; 341/144
(58) Field of Classification Search ............. 341/61, 341/155, 144; 379/400, 403, 398
See application file for complete search history.

(56) References Cited

U.S. PATENT DOCUMENTS

| | | | | |
|---|---|---|---|---|
| 4,999,798 A | * | 3/1991 | McCaslin et al. | 708/313 |
| 6,226,322 B1 | | 5/2001 | Mukherjee | |
| 6,430,220 B1 | * | 8/2002 | Determan | 375/238 |
| 6,961,094 B2 | * | 11/2005 | Kagawa | 348/441 |
| 7,088,818 B2 | * | 8/2006 | Prendergast et al. | 379/403 |
| 2001/0036261 A1 | | 11/2001 | Prendergast et al. | |

FOREIGN PATENT DOCUMENTS

EP    1 005 203 A1    5/2000

OTHER PUBLICATIONS

DeFatta, David J. "Digital Signal Processing." New York: John Wiley Sons, Inc., 1988. pp. 39, 63, 328-333 and 359-360 (10 Pages).

* cited by examiner

*Primary Examiner*—Brian Young
(74) *Attorney, Agent, or Firm*—Maginot, Moore & Beck

(57) ABSTRACT

A method and a device for interpolating or decimating a signal is provided, the signal being processed by a plurality of signal processing means connected in series, which at least comprise means for increasing or reducing a clock rate of the signal and filtering means. To achieve adaptation to different operating modes or transmission standards, individual portions of the signal processing means connected in series can be bridged by bypasses. In addition, filtering parameters of the filtering means can be varied and factors, by which a clock rate of the signal is increased or reduced, can be changed.

31 Claims, 1 Drawing Sheet

METHOD AND DEVICE FOR INTERPOLATING OR DECIMATING A SIGNAL

FIELD OF THE INVENTION

The present invention relates to a method and to a device for interpolating or decimating a signal, in particular an ADSL (Asymmetric Digital Subscriber Line) signal.

BACKGROUND

Data transmission, in particular of Internet data, using the ADSL standard, for example, is becoming increasingly more important inter alia in the private sector. As constantly increasing amounts of data have to be transmitted, the ADSL standard also has to be constantly developed and thus there are, for example, the transmission modes ADSL, ADSL+, ADSL2, ADSL2+ (including ADSL long reach), ADSL++ and ADSL2++ as well as a diagnostic mode called DrDSL. The ADSL types or ADSL flavours can be operated using single inverse fast Fourier transformation (1xIFFT) and apart from ADSL++ ADSL2++ also with double inverse fast Fourier transformation (2xIFFT).

In order to process ADSL data, interpolation or decimation of the data is required. A useful signal singly or doubly oversampled (1xIFFT/2xIFFT) by a data pump can be processed in an interpolation path. A received signal singly/doubly oversampled accordingly can be provided to a data pump in a decimation path. A higher data rate is achieved in each case due to the oversampling.

It is now desirable to provide circuits which can process a large number of ADSL transmission modes. One possibility for this purpose is to provide a separate interpolation path or decimation path for each ADSL transmission mode, a changeover being made between the paths, depending on the transmission standard currently being used. However, a solution of this type requires a large chip area and is therefore expensive to produce and it also has a relatively high power dissipation.

An object of the present invention is therefore to provide a method and a device for interpolating or decimating a signal, wherein a small chip area is required to implement the method and device and a power dissipation is reduced.

SUMMARY

The object is achieved by embodiments of methods or devices according to the present invention.

In accordance with the invention, for interpolating a signal it is proposed that the signal is processed by a plurality of signal processing means connected in series and which at least comprise means for increasing a clock rate of the signal and filtering means, wherein three different measures can be taken, independently of each other, but also in combination with each other, for adaptation to different transmission modes of the signal, for example different ADSL standards:

Firstly, a portion of the signal processing means connected in series can be bypassed as a function of the transmission mode of the signal, the portion of the signal processing means connected in series preferably comprising a filtering means of the filtering means and/or a means for increasing a clock rate of the signal of the means for increasing a clock rate of the signal.

Secondly, the means for increasing a clock rate of the signal may comprise a means for increasing the clock rate of the signal by a specific factor, the specific factor being determined as a function of the transmission mode of the signal.

Thirdly, filtering parameters of at least one filtering means of the filtering means can be determined as a function of the transmission mode of the signal. This at least one filtering means can, for example, comprise a low-pass filter, the filtering parameters comprising a threshold frequency of the low-pass filter in this case. The at least one filtering means can also comprise a finite impulse response filter, the filtering parameters comprising filtering coefficients and/or scaling of the finite impulse response filter in this case. The filtering parameters can also comprise an order of the at least one filter.

The means for increasing the frequency can, in the process, carry out zero stuffing, a repetition of values and/or comb filtering. The signal processing means preferably also comprise a digital-to-analog converter, which can also carry out noise shaping for suppressing noise, in order to provide the interpolated signal in analog form.

The above-described measures can also be used in a similar manner in a method for decimating a signal, wherein, in contrast to the case of interpolating a signal, means for reducing a clock rate of the signal instead of means for increasing a clock rate of the signal are provided, wherein, accordingly, as one of the possible measures, a factor, by which the frequency of the signal is reduced, is set as a function of the transmission mode of the signal.

In a manner corresponding to the digital-to-analog converter when interpolating the signal, an analog-to-digital converter, for example with sigma-delta modulators, can be provided when decimating the signal, in order to convert an analog signal into a digital signal for further processing by signal processing means.

As a result of the above-described measures, a single interpolation or decimation path can be provided for a plurality of transmission modes, an adaptation of the path taking place according to the illustrated measures, depending on the required transmission mode.

Means for detecting the transmission mode of the signal and control means for controlling the filter, jumpers or bypasses and/or means for increasing or reducing the frequency of the signal can be provided for controlling the described measures, with which adaptation to the transmission mode of the signal is possible. Detection can take place by means which automatically determine the transmission mode, but it is also possible for this transmission mode to be provided by another circuit or be manually adjusted.

BRIEF DESCRIPTION OF THE DRAWINGS

The invention will be described in more detail hereinafter using preferred embodiments and with reference to the accompanying drawings, in which.

DETAILED DESCRIPTION

Figure 1:
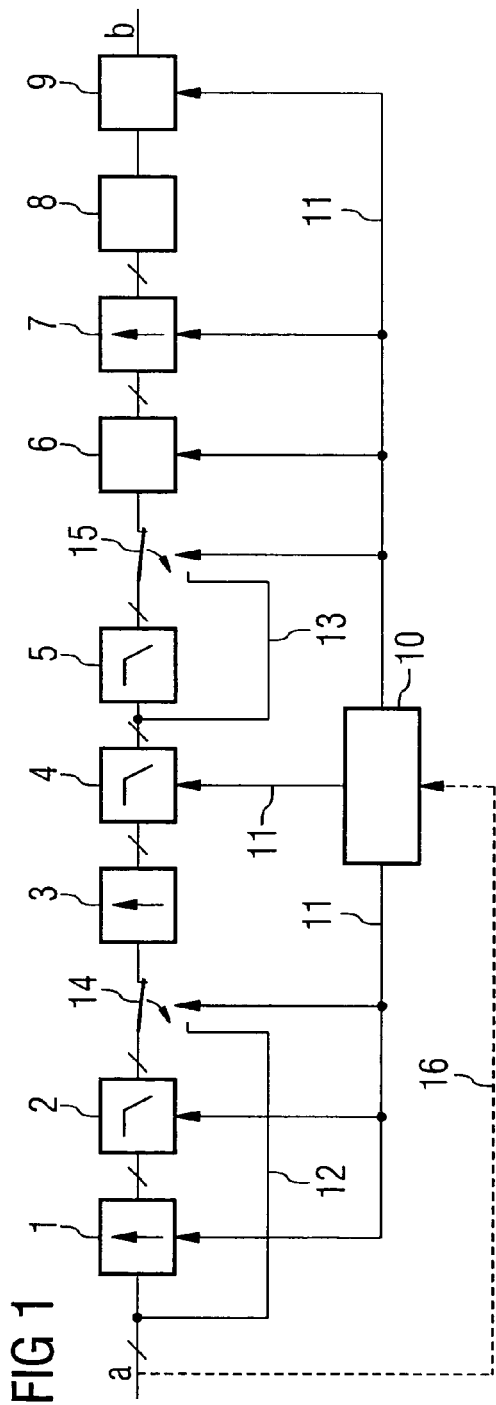
FIG. 1 shows an embodiment in accordance with the invention of a device for interpolating a signal.

FIG. 1 shows an embodiment in accordance with the invention for interpolating an ADSL signal. The input signal a is a digital signal in this case, which can be an ADSL signal, an ADSL+ signal, an ADSL++ signal with single inverse fast Fourier transformation (1xIFFT) or an ADSL signal or an ADSL+ signal with double inverse fast Fourier transformation (2xIFFT). The signal a has a different clock rate, depending on the ADSL transmission mode.

The signal a is firstly optionally processed by a first means 1 for increasing the clock rate and a first filter 2 or is diverted via a jumper or a bypass 12 past these two signal processing means 1, 2. The selection is made here via a switch 14. The bypass 12 is used here for signals with double inverse Fourier transformation, while signals with single inverse fast Fourier transformation are initially processed by the means 1 for increasing the clock rate. The clock rate is increased by a first factor which can be adjusted as a function of the transmission mode, i.e. the ADSL flavour used, and what is known as zero stuffing is carried out. This means that, during increase of the clock rate by the first factor, the value 0 is allocated to additionally included values.

The first filter 2 is configured as a programmable low-pass filter, of which the threshold frequency is adjusted as a function of the transmission standard or transmission mode to be processed corresponding to the respectively required or desired bandwidth.

The signal is then processed by second means 3 for increasing the clock rate, the clock rate being increased by a constant second factor for all transmission modes. This second means 3 for increasing the clock rate is configured as what is known as a repeater, in other words additionally included data values represent a repetition of a respective preceding data value.

A second low-pass filter 4 adjoins the second means 3 for increasing the clock rate. This second low-pass filter 4 can also be programmed and a threshold frequency is again adjusted as a function of the transmission mode.

The signal is then processed either by a third filter 5 or routed past the third filter 5 via a further bypass 13. This is controlled by a switch 15. In the present case ADSL signals and ADSL+ signals are routed via the bypass 13, while ADSL++ signals are processed by the third filter 5. The third filter 5 is configured in this case substantially like the second filter 4.

As the next signal processing means there follows an equaliser 6 to level out a ripple in the transmission band. The equaliser 6 is configured as a programmable finite impulse response (FIR) filter, coefficients and/or a scaling factor of the filter being adjusted as a function of the transmission mode to be processed.

A third means 7 for increasing the clock rate adjoins the equaliser 6, and is configured as a comb filter. The clock rate of the signal is increased by a third factor, which can again be adjusted as a function of the transmission mode. The first factor and the third factor are adjusted here—by taking account of the second factor—in such a way that the signal thus generated has a specific uniform clock rate independent of the transmission standard used.

This is followed by a digital-to-analog converter 8 to generate an analog signal from the 16 bit digital signal. What is known as noise shaping is preferably carried out prior to conversion to move the noise into a frequency range in which it can be subsequently filtered out. As the signal fed to the digital-to-analog converter has a fixed clock rate independent of the respective transmission mode, the digital-to-analog converter can also be operated with a constant clock rate, and, compared to a converter with a variable clock rate, this means less power dissipation.

Finally, an analog programmable reconstruction filter 9 (POFI, post filter) is provided. This is configured as a low-pass filter, of which the threshold frequency is again adjusted as a function of the transmission standard used. The conversion of signals with different oversampling results overall in the output signal b, oversampling corresponding to the product of the first to the third factors.

Control of the various filtering parameters, of the first and third factors and of the switches 14 and 15 is assumed here by a first control unit 10 via control lines 11. The control unit 10 can tap the input signal a via a line 16, shown in broken lines, and determine the respective transmission standard in order to automatically adjust the corresponding values. The transmission standard to be treated can, however, also be externally predetermined, for example by a manual adjustment or programming or by a signal from a different circuit unit.

Figure 2:
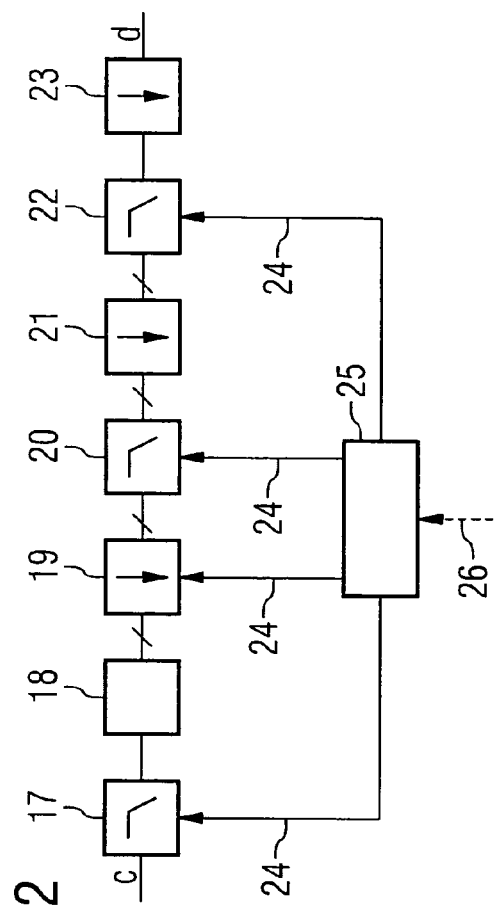
FIG. 2 shows an embodiment in accordance with the invention of a device for decimating a signal.

FIG. 2 shows a corresponding circuit path for decimation of a signal c, in this case an analog signal. The signals processed by this circuit path correspond in this case to ADSL signals with the same possible transmission modes as described above with the interpolation path of FIG. 1. DrDSL signals (diagnostic signals) may also be transmitted.

A control unit 25 is also provided here, similar to in FIG. 1, which adjusts the different variable parameters via control lines 24. The transmission standard to be processed can, for example, be externally predetermined via a line 26.

The signal c is firstly processed by an anti-aliasing filter 17 which is configured as an adjustable analog low-pass filter and of which the threshold frequency is again adjusted as a function of the transmission mode of the signal c. An automatic gain control (AGC) can also be provided upstream of the filter 17.

The thus filtered signal is digitised by an analog-to-digital converter. This can, for example, be configured as a sigma-delta converter 18. The analog-to-digital converter operates with a fixed clock rate, so the signal generated thereby has a fixed clock rate. This clock rate is reduced by a first means 19 for reducing the clock rate. This first means 19 for reducing the clock rate is configured as a comb filter, the clock rate is reduced by a fourth factor, the fourth factor being adjusted as a function of the transmission mode of the signal.

The signal thus generated is filtered by a filter 20 which can, for example, be configured as a programmable low-pass filter. The threshold frequency of this filter is again adjusted as a function of the transmission mode used.

A second means 21 for reducing the clock frequency adjoins this filter 20, the clock rate of the signal being reduced by a constant fifth factor independently of the transmission mode used. A further programmable low-pass filter 22 then follows. The threshold frequency is again adjusted as a function of the transmission mode used. An order of the filter 22 is also adjusted as a function of the transmission mode used.

Finally, in a third means 23 for reducing the clock rate, the clock rate of the signal is reduced by a constant sixth factor, again independently of the transmission standard used. The output signal d therefore has a clock rate that depends on the fourth, fifth and sixth factors, which are adjusted or fixed in such a way that a predetermined or desired clock rate of the output signal d is achieved for the respective transmission mode.

Obviously the parameter values, the arrangement and number of the various components and the illustrated transmission standards or transmission modes indicated above are to be understood as being merely exemplary. The interpolation path or decimation path can be accordingly adapted and changed, depending on the signals to be processed. Other types of filter may also be used, instead of those indicated, of which the filtering parameters are then adjusted as a function of the desired transmission mode and/or a predetermined bandwidth. The decimation path—like the interpolation path—may also contain bypasses, if specific signal processing means are to be used only for specific signals.

The invention claimed is:

1. A method for interpolating a signal, comprising:
   a) processing the signal using a plurality of signal processing elements connected in series, said processing including increasing a clock rate of the signal and filtering the signal, and
   b) selectively bypassing at least a portion of the plurality of signal processing elements as a function of a transmission mode of the signal,
   wherein step a) further comprises increasing the clock rate using at least one a group consisting of carrying out a zero stuffing, repeating values and comb filtering.

2. The method according to claim 1, wherein step b) further comprises selectively bypassing a filter of the plurality of signal processing elements.

3. The method according to claim 1, wherein step b) further comprises selectively bypassing one or more of the plurality of signal processing elements that are operable to increase the clock rate of the signal.

4. The method according to claim 1, wherein the signal is an ADSL signal.

5. The method according to claim 1, wherein the transmission mode of the signal is an ADSL standard.

6. A method for interpolating a signal, comprising:
   a) processing the signal using a plurality of signal processing elements connected in series, said processing including increasing a clock rate of the signal by a specific factor and filtering the signal, and
   b) adjusting the specific factor as a function of a transmission mode of the signal,
   wherein step a) further comprises increasing the clock rate using at least one a group consisting of carrying out a zero stuffing, repeating values and comb filtering.

7. The method according to claim 6, wherein the signal is an ADSL signal.

8. The method according to claim 6, wherein the transmission mode of the signal is an ADSL standard.

9. A method for interpolating a signal, comprising:
   a) processing the signal using a plurality of signal processing elements connected in series, said processing including increasing a clock rate of the signal and filtering the signal using filtering parameters, and
   b) adjusting the filtering parameters as a function of a transmission mode of the signal,
   wherein step a) further comprises filtering the signal using a low-pass filter and wherein the filtering parameters include a threshold frequency of the low-pass filter.

10. The method according to claim 9, wherein step a) further comprises filtering the signal using one ore more filters and wherein the filtering parameters comprise an order of the at least one of the one or more filters.

11. The method according to claim 9, wherein the signal is an ADSL signal.

12. The method according to claim 9, wherein the transmission mode of the signal is an ADSL standard.

13. A method for decimating a signal, comprising:
   a) processing the signal using a plurality of signal processing elements connected in series, said processing including decreasing a clock rate of the signal and filtering the signal using filtering parameters, and
   b) adjusting the filtering parameters as a function of a transmission mode of the signal,
   wherein step a) further comprises:
   processing the signal using a plurality of signal processing elements connected in series, said processing including decreasing a clock rate of the signal by a specific factor and filtering the signal, and
   wherein step b) further comprises
   b) adjusting the specific factor as a function of a transmission mode of the signal.

14. The method according to claim 13, wherein the signal is an ADSL signal.

15. The method according to claim 13, wherein the transmission mode of the signal is an ADSL standard.

16. An apparatus configured to interpolate a signal, comprising:
   a plurality of signal processing elements connected in series operably coupled to receive the signal, the plurality of signal processing elements including one or more elements configured to increase a clock rate of the signal and a filter;
   a switchable bypass branch operably coupled to switchably bypass a portion of the plurality of signal processing elements; and
   a control element configured to cause the bypass branch to switchably bypass the portion of the plurality of signal processing elements as a function of a transmission mode of the signal;
   wherein the one or more elements configured to increase a clock rate of the signal are configured to increase the clock rate using at least one a group of carrying out a zero stuffing, repeating values and comb filtering.

17. The apparatus according to claim 16, wherein the portion of the plurality of signal processing elements includes the filter.

18. The apparatus according to claim 16, wherein the portion of the plurality of signal processing elements includes the one or more elements configured to increase the clock rate of the signal.

19. An apparatus configured to interpolate a signal, comprising:
   a plurality of signal processing elements connected in series operably coupled to receive the signal, the plurality of signal processing elements including one or more elements configured to increase a clock rate of the signal and a filter having adjustable filtering parameters; and
   a control element configured to selectively adjust the adjustable filtering parameters as a function of a transmission mode of the signal,
   wherein the filter comprises a low-pass filter and the adjustable filtering parameters include a threshold frequency of the low-pass filter.

20. The apparatus of claim 19, wherein the adjustable filtering parameters include an order of the filter.

21. An apparatus configured to interpolate a signal, comprising:
   a plurality of signal processing elements connected in series operably coupled to receive the signal, the plurality of signal processing elements including one or more elements configured to increase a clock rate of the signal by a specific factor and a filter; and
   a control element configured to selectively adjust the specific factor as a function of a transmission mode of the signal;
   wherein the one or more elements configured to increase a clock rate of the signal are configured to increase the clock rate using at least one of a group of carrying out a zero stuffing, repeating values and comb filtering.

22. The apparatus of claim 21, wherein the plurality of signal processing elements includes a digital-to-analog converter.

23. The apparatus of claim 22, wherein the digital-to-analog converter is configured to carry out noise shaping.

24. The apparatus of claim 22, wherein the digital-to-analog converter is configured to operate using a fixed clock rate independent of the transmission mode.

25. An apparatus configured to decimate a signal, comprising:
a plurality of signal processing elements connected in series operably coupled to receive the signal, the plurality of signal processing elements including one or more elements configured to reduce a clock rate of the signal and a filter having adjustable filtering parameters, wherein the plurality of signal processing elements includes one or more elements configured to reduce a clock rate of the signal by a specific factor and a filter;
a control element configured to selectively adjust the specific factor and the adjustable filtering parameters as a function of a transmission mode of the signal;
wherein the plurality of signal processing elements includes an analog-to-digital converter.

26. The apparatus of claim 25, wherein the analog-to digital converter comprises a sigma-delta modulator.

27. The apparatus of claim 25, wherein the analog-to-digital converter is configured to operate using a fixed clock rate independent of the transmission mode.

28. A method for interpolating a signal, comprising:
a) processing the signal using a plurality of signal processing elements connected in series, said processing including increasing a clock rate of the signal and filtering the signal using filtering parameters, and
b) adjusting the filtering parameters as a function of a transmission mode of the signal,
wherein the signal processing elements comprise a low-pass filter downstream of a digital to analog converter, wherein the digital to analog converter is operated with a fixed clock rate independent of a transmission mode of a signal and a threshold frequency of the low-pass filter is adjusted depending on the transmission mode of the signal.

29. An apparatus configured to interpolate a signal, comprising:
a plurality of signal processing elements connected in series operably coupled to receive the signal, the plurality of signal processing elements including one or more elements configured to increase a clock rate of the signal and a filter having adjustable filtering parameters, and
a control element configured to selectively adjust the adjustable filtering parameters as a function of a transmission mode of the signal,
wherein the signal processing elements comprise a low-pass filter downstream of a digital to analog converter, wherein the digital to analog converter is operated with a fixed clock rate independent of a transmission mode of a signal and a threshold frequency of the low-pass filter is adjusted depending on the transmission mode of the signal;

30. A method for decimating a signal, comprising:
a) processing the signal using a plurality of signal processing elements connected in series, said processing including decreasing a clock rate of the signal and filtering the signal using filtering parameters, and
b) adjusting the filtering parameters as a function of a transmission mode of the signal,
wherein the signal processing elements comprise a low-pass filter up-stream of an analog to digital converter, wherein the analog to digital converter is operated with a fixed clock independent of the transmission mode of the signal and wherein a threshold frequency of the low-path filter is adjusted depending on the transmission mode of the signal.

31. An apparatus configured to decimate a signal, comprising:
a plurality of signal processing elements connected in series operably coupled to receive the signal, the plurality of signal processing elements including one or more elements configured to reduce a clock rate of the signal and a filter having adjustable filtering parameters, and
a control element configured to selectively adjust the adjustable filtering parameters as a function of a transmission mode of the signal,
wherein the signal processing elements comprise a low-pass filter up-stream of an analog to digital converter, wherein the analog to digital converter is operated with a fixed clock independent of the transmission mode of the signal and wherein a threshold frequency of the low-path filter is adjusted depending on the transmission mode of the signal.

* * * * *